United States Patent
Tong et al.

(10) Patent No.: US 6,744,744 B1
(45) Date of Patent: Jun. 1, 2004

(54) RATE MATCHING AND CHANNEL INTERLEAVING FOR A COMMUNICATIONS SYSTEM

(75) Inventors: Wen Tong, Ottawa (CA); Catherine Leretaille, Paris (FR); Stephane Gosne, Paris (FR)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/544,981

(22) Filed: Apr. 7, 2000

(30) Foreign Application Priority Data

Apr. 13, 1999 (CA) .............................................. 2268853

(51) Int. Cl.[7] .............................. H04B 1/10; H04B 1/66
(52) U.S. Cl. ....................... 370/320; 370/335; 370/342; 370/441; 370/477; 370/479
(58) Field of Search ......................... 370/477; 375/265; 714/786, 790, 792

(56) References Cited

U.S. PATENT DOCUMENTS

| | | | |
|---|---|---|---|
| 5,689,511 A | * 11/1997 | Shimazaki et al. | ......... 370/545 |
| 6,101,626 A | * 8/2000 | Morelos-Zaragoza et al. | ........................... 714/786 |
| 6,147,964 A | * 11/2000 | Black et al. | ................. 370/209 |
| 6,170,076 B1 | * 1/2001 | Kim | ........................... 714/786 |
| 6,370,669 B1 | * 4/2002 | Eroz et al. | ................... 714/774 |
| 6,430,722 B1 | * 8/2002 | Eroz et al. | ................... 714/755 |

FOREIGN PATENT DOCUMENTS

| EP | 1 227 596 A | 7/2002 |
|---|---|---|
| WO | WO 99 65148 A | 12/1999 |

OTHER PUBLICATIONS

European Search Report EP 00 30 3056 dated Nov. 11, 2002.
Baier A, et al—Design Study for a CDMA–Based Third–Generation Mobile Radio System IEEE Journal on Selected Areas in Communications, IEEE INC, New York vol. 12, No. 4,—May 1, 1994 pp. 733–743 XP000572845—Issn: 0733–8716.

* cited by examiner

*Primary Examiner*—Huy D. Vu
*Assistant Examiner*—Daniel Ryman
(74) *Attorney, Agent, or Firm*—Mintz, Levin, Cohn, Ferris, Glovsky and Popeo, P.C.

(57) ABSTRACT

Matching a rate of data bits, in a matrix of data bits interleaved by a predetermined interleaving process, to a desired rate by deletion of redundant data bits or repetition of data bits derived from the matrix. It includes steps of determining in a non-interleaved matrix of the data bits a pattern of bits to be deleted or repeated to provide the desired data rate, decoding an address of each bit in said pattern in a manner inverse to the interleaving process to product a respective address of the bit in the matrix of interleaved data bits, and deleting or repeating the respective bit in the interleaved data bits in dependence upon the respective address. The address decoding is performed in the same manner as a coding of addresses for producing the interleaved data bits from the non-interleaved matrix of the data bits.

13 Claims, 4 Drawing Sheets

RATE MATCHING AND CHANNEL INTERLEAVING FOR A COMMUNICATIONS SYSTEM

RELATED APPLICATION

U.S. patent application Ser. No. 09/531,470 filed Mar. 20, 2000 in the names of Wen Tong et al., entitled "Data Interleaver And Method Of Interleaving Data", describes and claims a method of interleaving data and a data interleaver which advantageously can be used to provide the channel interleaving referred to below.

BACKGROUND

It is well known to perform interleaving of data in a communications system using forward error correction (FEC) in order, on deinterleaving, to distribute errors to facilitate their correction. Typically, such interleaving uses a block interleaver to interleave blocks of data. So-called turbo coding (parallel concatenated convolutional coding) uses an interleaver between inputs to two convolutional coders which produce respective parity bits from the input data before and after interleaving. With increasing attention being given to the use of turbo coding, particularly in wireless communications systems, attention has also been given to the form of the interleaver.

So-called 3rd generation CDMA (code division multiple access) wireless communications systems are also being developed which require a channel or inter-frame interleaver which operates to interleave or permute data in blocks corresponding to the radio frame duration, typically 10 ms. In such systems the channel interleaver either precedes or follows a rate matching function which serves to match various data rates to the radio frame rate, and which typically involves puncturing (omission) or repetition of data symbols, in this case data bits. It is desirable to distribute the omitted or repeated bits as evenly as possible, with as great a distance as possible between punctured or repeated bits in the de-interleaved frames, in a manner that is easy to implement and that is relatively independent of variables such as the frame-size, number of frames, and puncturing rate.

The present invention is concerned with rate matching in a manner which can be used with particular advantage for data after channel interleaving as described and claimed in the related application referred to above, but which is also applicable to other forms of interleaved data. This invention also provides improvements in and further applications of such channel interleaving.

SUMMARY OF THE INVENTION

According to one aspect, this invention provides a method of matching a rate of data bits, in a matrix of data bits interleaved by a predetermined interleaving process, to a desired rate by deletion of redundant data bits or repetition of data bits derived from the matrix, including the steps of: determining in a non-interleaved-matrix of said data bits a pattern of bits to be deleted or repeated to provide said desired data rate; decoding an address of each bit in said pattern in a manner inverse to the interleaving process to produce a respective address of the bit in the matrix of interleaved data bits; and deleting or repeating the respective bit in the interleaved data bits in dependence upon the respective address.

It is particularly advantageous, and may be necessary in practice, for the address decoding to be performed in the same manner as a coding of addresses for producing the interleaved data bits from the non-interleaved matrix of said data bits. This is facilitated in preferred embodiments of the method of the invention by the interleaving process comprising permuting rows and columns of a matrix of $N_r$ rows and $N_c$ columns, in which data bits to be interleaved are represented row by row, in accordance with:

Row Permutation $I_r(k) = [\alpha_r k + f_c(l)] \bmod N_r$,

Column Permutation $I_c(l) = [\alpha_c l + f_r(k)] \bmod N_c$ where $I_r(k)$ represents a data bit with a row index k, k is an integer from 1 to $N_r$, $\alpha_r$ is an integer, $f_c(l)$ is a non-zero function of a column index l, l is an integer from 1 to $N_c$, $I_c(l)$ represents a data bit with the column index l, $\alpha_c$ is an integer, $f_r(k)$ is zero or a function of the row index k, and $\bmod N_r$ and $\bmod N_c$ represent modulo-$N_r$ and modulo-$N_c$ arithmetic respectively, interleaved data bits being derived from the matrix column by column.

It is currently considered optimum to choose $f_c(l) = ml + [N_r + 1] \bmod 2$, where m is an integer, m approximately equal to $N_r/N_c$, $f_r(k) = 2k + [N_c + 1] \bmod 2$, and $\alpha_r$ as the largest prime number less than $N_r/\log_2(\log_2(N_r))$.

The invention also provides rate matching apparatus arranged for carrying out a method as recited above.

Another aspect of this invention provides a method of interleaving data bits comprising permuting rows and columns of a matrix of $N_r$ rows and $N_c$ columns, in which data bits to be interleaved are represented row by row, in accordance with:

Row Permutation $I_r(k) = [\alpha_r k + f_c(l)] \bmod N_r$,

Column Permutation $I_c(l) = [\alpha_c l + f_r(k)] \bmod N_c$ where $I_r(k)$ represents a data bit with a row index k, k is an integer from 1 to $N_r$, $\alpha_r$ is an integer, $f_c(l) = ml + [N_r + 1] \bmod 2$ is a non-zero function of a column index l, l is an integer from 1 to $N_c$, m is an integer, $I_c(l)$ represents a data bit with the column index l, $\alpha_c$ is an integer, $f_r(k) = 2k + [N_c + 1] \bmod 2$, and mod2, $\bmod N_r$ and $\bmod N_c$ represent modulo-2, modulo-$N_r$, and modulo-$N_c$ arithmetic respectively, interleaved data bits being derived from the matrix column by column.

The invention also provides a data interleaver arranged for carrying out this method.

Another aspect of the invention provides a method of interleaving and rate matching parallel concatenated convolutional coded data by deletion of coded data bits, the coded data bits comprising systematic bits and parity bits, including the steps of interleaving the systematic bits separately from the parity bits, and deleting parity bits from the interleaved parity bits to provide the rate matching.

A further aspect of the invention provides a method of interleaving and rate matching parallel concatenated convolutional coded data by repetition of coded data bits, the coded data bits comprising systematic bits and parity bits, including the steps of interleaving the systematic bits separately from the parity bits, and repeating parity bits of the interleaved parity bits with a greater repetition factor than any repetition of systematic bits of the interleaved systematic bits, to provide the rate matching.

The invention further provides coding, interleaving, and rate matching apparatus arranged to carry out these methods.

Yet another aspect of this invention relates to a method of shuffling interleaved and rate matched data streams in the manner described below with reference to FIG. 4 of the drawings, and to the recursive application of this method to more than two such data streams.

BRIEF DESCRIPTION OF THE DRAWINGS

The invention will be further understood from the following description with reference to the accompanying drawings, in which.

DETAILED DESCRIPTION

Figure 1:
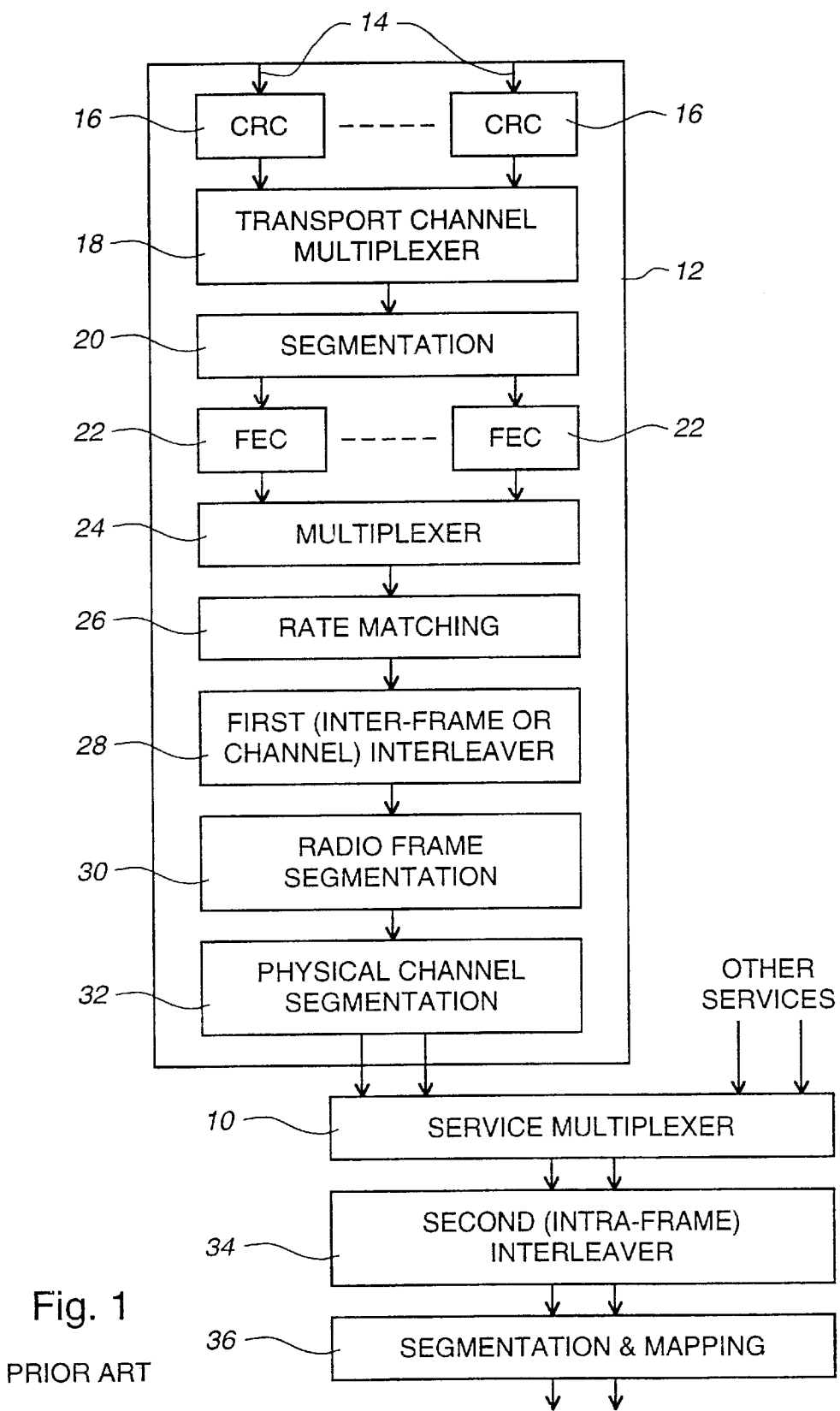
FIG. 1 illustrates a known arrangement for service multiplexing and channel interleaving in a 3rd generation CDMA communications system.

Referring to FIG. 1, there is illustrated a known arrangement for service multiplexing and channel interleaving in a 3rd generation CDMA radio communications system. The arrangement includes a service multiplexer 10 which serves to multiplex together a plurality of data signal streams, referred to as main stream services or QoS (Quality of Service) channels, which are supplied via respective service blocks 12 only one of which is illustrated. Each service block 12 is supplied at inputs 14 with a plurality of constituent input signals, which may for example comprise any of various types of signals such as voice, data, and multimedia signals. These input signals may have arbitrary transmission rates, frame sizes, and other parameters. The input signals have CRC (cyclic redundancy check) codes added in blocks 16 and are multiplexed together in a transport channel multiplexer 18. The multiplexed signals are segmented, for encoding, in a segmentation block 20, and the segmented signals are subjected to FEC (forward error correction) coding in FEC blocks 22. The encoded signals are multiplexed in a multiplexer 24.

The multiplexed signals are subjected to rate matching (puncturing (deletion) of redundant data symbols (bits) or repetition of data symbols (bits)) in a block 26 to match the data rate to the radio communications rate (air rate) with radio frames of 10 ms duration. Primarily in order to separate adjacent bits to reduce the adverse effects of errors due to fading in the radio channel, the data bits are interleaved in a first interleaver 28, which is referred to as a channel or inter-frame interleaver because it operates to permute blocks each of 10 ms of data bits. Although in FIG. 1 the interleaver 28 is shown following the rate matching block 26, as discussed further below the positions of these functions may be interchanged, the multiplexed signals from the multiplexer 24 being supplied to the channel interleaver 28, and the interleaved signals from the interleaver being supplied to the rate matching block 26. For example, these functions may be in the order shown in FIG. 1 for downlink transmission of signals from a central station, and may be in the reversed order for uplink transmission of signals to the central station.

Following the functions 26 and 28, the resulting rate matched and interleaved signals are segmented for radio frames and physical channels in segmentation blocks 30 and 32 respectively to produce the signals for multiplexing by the multiplexer 10. Signals output by the multiplexer 10 are interleaved by a second interleaver 34 the outputs of which are segmented and mapped to dedicated physical channels in a segmentation and mapping block 36 for communications via a CDMA radio communications path in known manner.

As described in the related application referred to above, the first interleaver 28 can have a performance that is sufficiently good to enable the second interleaver 34 to be omitted or reduced to a simple shuffling operation, for example as described below. This is desirable in particular because otherwise the second interleaver 34 has the potential to degrade the interleaving performed by each first interleaver 28, whereas each first interleaver 28 can be optimized for its particular rate matched data stream and QoS.

Accordingly, the first interleaver 28 is implemented as an algebraic interleaver providing a good random spreading property. The multiple encoded bit blocks or data transport frames for each QoS channel are mapped into a 2-dimensional matrix and are subjected to linear congruential rules to permute the rows and columns of the matrix to implement the interleaving function. A maximum interleaving depth and time span can be determined by searching a set of best parameters. The interleaver consequently has a relatively simple form without disadvantages of known interleavers, such as requiring large memory sizes for look-up tables or inadequately accommodating the rate matching function.

Although the following description refers to rows and columns of a matrix, it should be understood that this is for convenience and clarity, that the rows and columns can be interchanged without changing the function of the interleaver, and that in practice and as described below the interleaver can operate by equivalent control of read or write addressing of memory locations of a linear memory in which data bits are stored, without any actual movement of the stored bits among the memory locations.

The interleaver 26 as described in the related application referred to above operates to implement the following three steps:

1. Represent a number $N_c$ of encoded blocks of data bits each of length $N_r$ data bits as a matrix of $N_r$ rows and $N_c$ columns.
2. Permute the rows and columns of the matrix in accordance with:

Row Permutation $I_r(k)=[\alpha_r k+f_c(l)]\bmod N_r$

Column Permutation $I_c(l)=[\alpha_c l+f_r(k)]\bmod N_c$ where $I_r(k)$ represents a data bit with a row index k, k is an integer from 1 to $N_r$, $\alpha_r$ is a row permutation parameter and is an integer, $f_c(l)$ is a positive function of a column index l, l is an integer from 1 to $N_c$, $I_c(l)$ represents a data bit with the column index I, $\alpha_c$ is a column permutation parameter and is an integer, $f_r(k)$ is a positive function of the row index k, and $\bmod N_r$ and $\bmod N_c$ represent modulo-$N_r$ and modulo-$N_c$ arithmetic respectively.
3. Derive interleaved data bits from the matrix column by column.

Step 1 can be slightly modified to accommodate different numbers of data transport frames with a given number of columns of the matrix. For example the matrix can have $N_c=8$ columns for $N_c/\gamma$ data transport frames where $\gamma=1, 2, 4,$ or 8, the matrix having $N_r/\gamma$ rows accordingly, with a consequent modification of step 3 to read out $\gamma$ columns of the matrix per radio frame accordingly. For simplicity in the description below, it is assumed that $\gamma=1$ with $N_c=8$.

For step 2, the row permutation parameter $\alpha_r$ is chosen to be the largest prime number less than $\lfloor N_r/\log_2(\log_2(N_r))\rfloor$, the column permutation parameter $\alpha_c$ is chosen to be the largest prime number less than $\lfloor N_c\rfloor$, the function $f_c(l)=ml+[N_r+1]\bmod 2$, where m is an integer equal to $\lceil N_r/N_c\rceil$, and the function $f_r(k)=2k+[N_c+1]\bmod 2$. The symbols $\lfloor\ \rfloor$ refer to rounding down to an integer, and the symbols $\lceil\ \rceil$ refer to rounding up to an integer. It can be appreciated that $[N_r+1]\bmod 2$ is zero when $N_r$ is odd and is one when $N_r$ is even, and that $[N_c+1]\bmod 2$ is zero when $N_c$ is odd and is one when $N_c$ is even, so that these parts of the functions $f_c(l)$ and $f_r(k)$ are simply the addition of one when the respective number $N_r$ or $N_c$ is even.

As indicated above, the rate matching punctures (deletes) redundant data bits (which are present as a result of the FEC encoding blocks 22) in the event that the data transport frame size is larger than the radio frame size, a maximum puncturing ratio being 20% of the transport frame size. Conversely, if the data transport frame size is smaller than the radio frame size, bits of the transport frame are repeated to achieve the rate matching. The rate matching is desired as far as possible to maximize the separation distances between the punctured bits and to equalize the number of punctured bits in each radio frame, i.e. to distribute the punctured bits uniformly among the radio frames with maximum separation.

Figure 2:
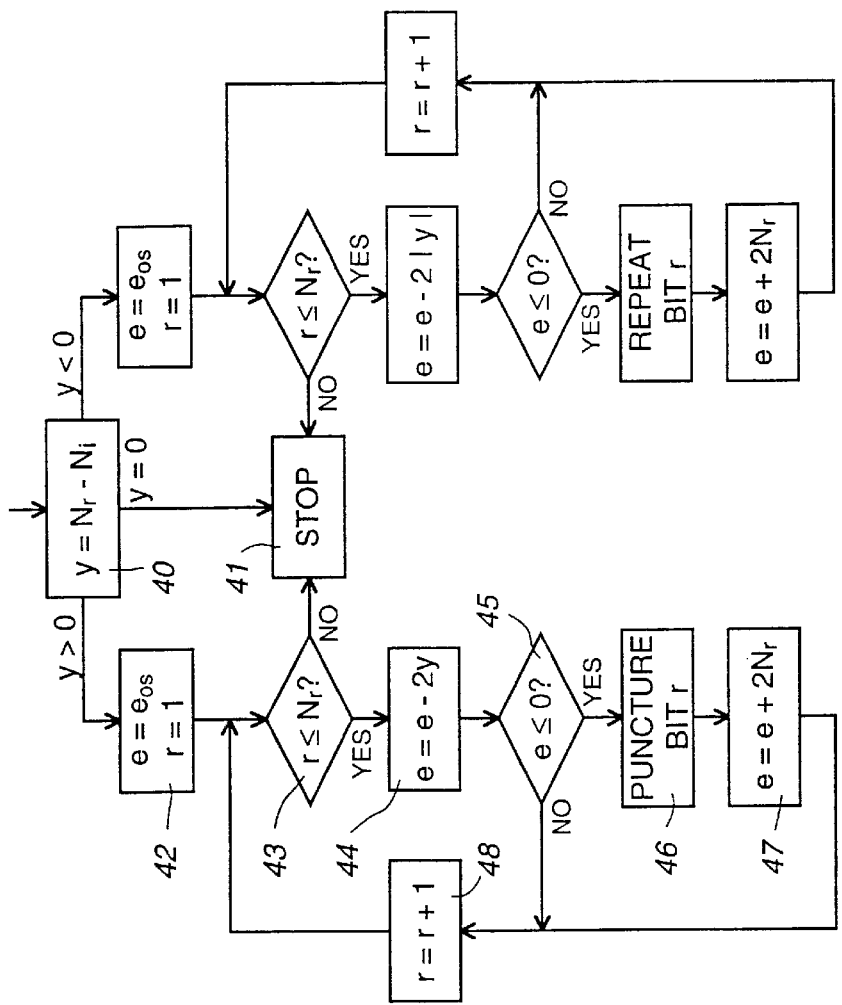
FIG. 2 is a flow chart relating to a known rate matching algorithm.

In the case where the rate matching block 26 precedes the channel interleaver 28 as shown in FIG. 1, a known rate matching method as shown in FIG. 2 can be used.

Referring to FIG. 2, for each radio frame of segmentation size $N_i$ bits, in a block 40 an integer y is determined as $y=N_r-N_i$, y being greater than zero (positive) in the event that puncturing is required, being less than zero (negative) in the event that repetition of |y| bits is required, and being zero if no puncturing or repetition is required, a stop block 41 being reached in the latter event. As the steps shown in FIG. 2 are substantially the same for bit repetition (y<0, shown at the right in FIG. 2) as for puncturing (y>0, shown at the left in FIG. 2), except for the use of |y| and repetition instead of y and puncturing, only the case of puncturing is described in detail below.

If y>0, puncturing of y of the $N_r$ bits of the transport frame is required to produce the $N_i$ bits of the radio frame. In this case in a block 42 a parameter e is initialized to a starting offset $e_{os}$ which is determined in any desired manner for the particular radio frame, and a row counter r is initialized to 1. In a block 43, it is determined whether $r\leq N_r$ and, if so, in a block 44 the value of e is reduced by 2y. In a subsequent decision block 45 it is determined whether $e\leq 0$, and if so the bit in the row r is punctured at a block 46, the value of e is increased by $2N_r$ in a block 47, the row counter r is increased by 1 in a block 48, and a return is made to the decision block 43. A negative decision at the block 45 (i.e. e>0) results in a return to the block 43 via the block 48 to increment the row counter r without any puncturing or change in the value of e. A negative decision at the block 43 (i.e. $r>N_r$) indicates that the end of the frame has been reached, and accordingly the sequence ends at the stop block 41.

However, in the case where the rate matching block 26 follows the channel interleaver 28, the rate matching is carried out on the permuted (interleaved) bit stream and the problem of rate matching is considerably more complicated. Generally, the requirements of the channel interleaving and rate matching processes are not consistent.

More particularly, the design of an appropriate, and desirably optimized, rate matching pattern of punctured or repeated bits within the matrix of bits after the channel interleaving process represents a very complex or impractical task. This invention avoids this problem by providing an appropriate, and desirably optimized, rate matching pattern of punctured or repeated bits for the matrix before interleaving, and using a de-interleaving or decoding process to determine corresponding bits to be punctured or repeated at the output of the channel interleaver. This process is facilitated by the fact that the de-interleaving, or decoding, process can be implemented by exactly the same structure as the interleaving process, as further described below. For convenience and clarity, the following description refers to the matrix of bits before interleaving (or after de-interleaving) as the natural matrix NM, and to the matrix of bits after interleaving as the randomized matrix RM.

Figure 3:
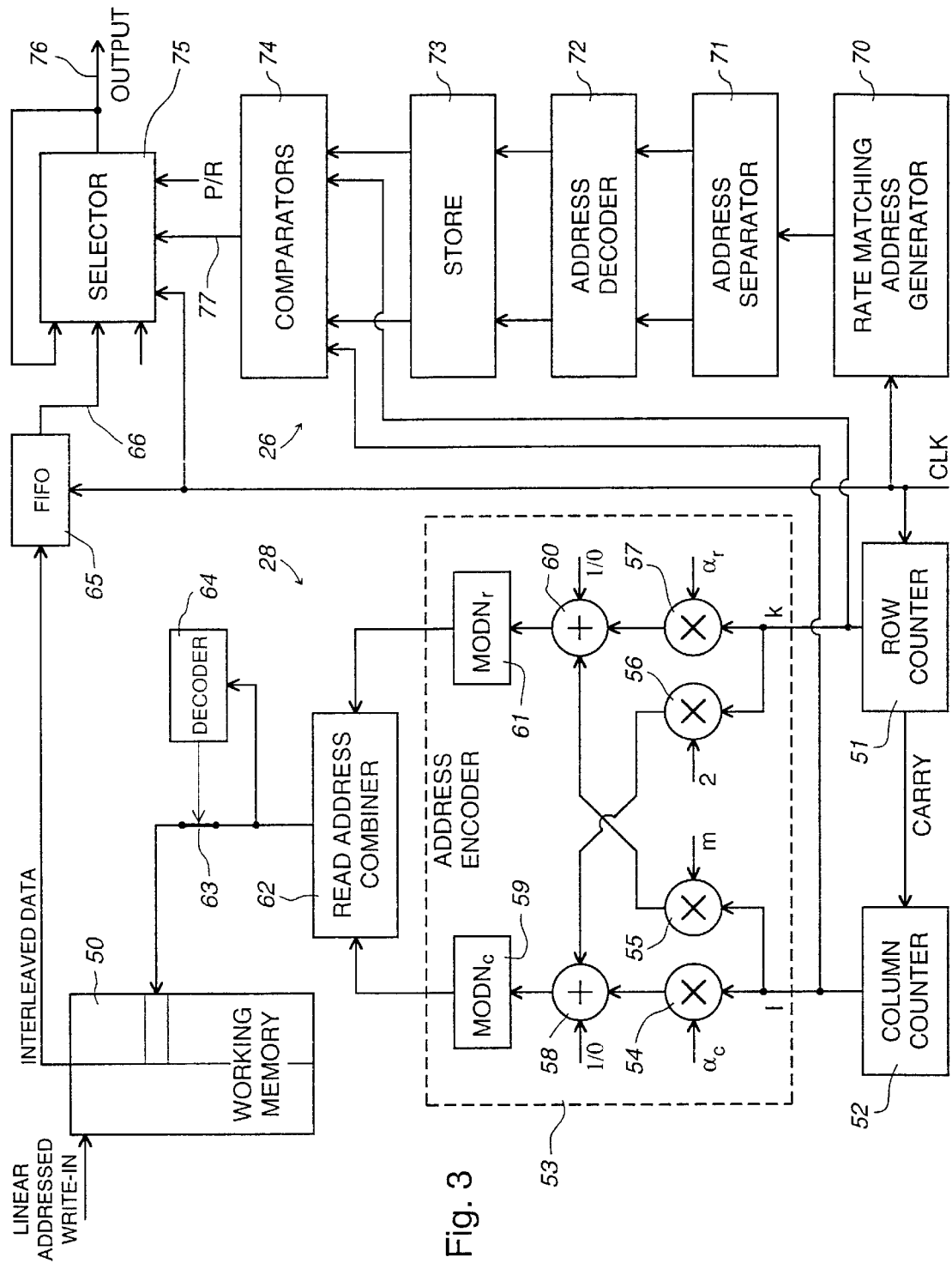
FIG. 3 illustrates an implementation of an interleaver and a rate matching arrangement in accordance with an embodiment of this invention.

FIG. 3 illustrates an implementation of a channel interleaver 28 and rate matching block 26 in accordance with an embodiment of this invention. As illustrated in FIG. 3, the interleaver 26 includes a working memory 50 with two halves, alternately used in known manner for writing into and reading from the memory, each for storing the $N_rN_c$ data bits represented in the matrix as described above, these data bits being written into the memory linearly corresponding to the row-by-row organization of the matrix. A modulo-$N_r$ row counter 51 is responsive to a clock signal CLK to provide a count representing the row index k, and a carry output of this counter 51 is supplied to a modulo-$N_c$ column counter 52 to provide a count representing the column index l. The counts k and l of the counters 51 and 52 are supplied to an address encoder 53 shown within a dashed line box in FIG. 3. More specifically, the count of the column counter 53 is supplied to multipliers 54 and 55 which are also supplied with the parameters $\alpha_c$ and m respectively to produce products representing $\alpha_c l$ and ml respectively, and the count of the row counter 51 is supplied to multipliers 56 and 57 which are also supplied with the integer 2 and the parameter $\alpha_r$ respectively to produce products representing 2k and $\alpha_r k$ respectively. An adder 58 adds the outputs of the multipliers 54 and 56 and selectively adds 1 or 0 depending upon whether $N_c$ is even or odd respectively, and the output of the adder 58 is reduced to modulo-$N_c$ form by a modulo function 59 to complete the column permutation function described above. An adder 60 adds the outputs of the multipliers 55 and 57 and selectively adds 1 or 0 depending upon whether $N_r$ is even or odd respectively, and the output of the adder 60 is reduced to modulo-$N_r$ form by a modulo function 61 to complete the row permutation function described above. Each of the modulo functions 59 and 61 can comprise comparison and subtraction functions. Outputs of the functions 59 and 61 are combined in a read address combiner 62 to produce an address for reading the respective data bit in its interleaved sequence from the memory 50. As illustrated in FIG. 3, the read address is supplied to the memory 50 via a switch 63 which is provided as described below.

If the number of rows $N_r$ is a power of two, then the address combiner 62 can simply combine the output of the modulo function 61 as the least significant bits, and the output of the modulo function 59 as the most significant bits, of the read address for the memory 50; equivalently the output of the function 61 is added by the address combiner 62 to $N_r$ times the output of the function 59.

It may be desired to interleave data bits in arbitrary-sized frames that are not an integer multiple of $N_c$. In this case, the number of rows of the matrix is selected to accommodate all of the data bits to be interleaved, and the last few (less than $N_c$) memory locations in the working memory 50 are not written into. In order to omit the data bits of these memory locations from the interleaved data bits, the interleaver 28 of FIG. 3 also includes a decoder 64 which detects these memory locations in the read address output of the address combiner 62, and upon such detection opens the switch 63 to prevent reading of data from the memory 50 in respect of these locations. In order to provide a constant data output rate of the interleaved data bits from the memory 50, the interleaver 28 of FIG. 3 further includes a FIFO (first-in, first-out) memory 65, clocked by the clock signal CLK, via which the interleaved data bits are supplied to an output line 66 of the interleaver, the FIFO 65 being pre-filled at the start of each interleaving operation and having a size (e.g. up to $N_c$) sufficient to allow for the non-read, and hence omitted, memory locations.

The interleaved data bits on the line 66 are supplied to the rate matching block or function 26 also illustrated in FIG. 3. This rate matching function comprises a rate matching address generator 70 which is also supplied with the clock signal CLK, an address separator 71, an address decoder 72, a buffer or store 73, comparators 74, and a data bit selector 75 providing a rate matched data output on a line 76. Similarly to the provision of the FIFO 65 for providing a constant data bit rate output of the interleaver 28, the rate matching function 26 may also include a FIFO or other buffer (not shown) for providing a constant rate of data bits from the output line 76.

The rate matching address generator 70 generates at its output, as described further below, the address in the natural matrix NM of each punctured or repeated bit in accordance with the puncturing or repetition pattern which is determined for this process. This address is separated into most significant and least significant components by the address separator 71, whose operation is inverse to that of the read address combiner 62 described above. Thus if the number of rows $N_r$ is a power of two, then the address separator 71 can simply separate the address bits output by the generator 70 into most significant bits and least significant bits; equivalently the address from the generator 70 is divided by $N_r$ to produce an integer quotient and a remainder which constitute the two outputs of the address separator 71.

The address decoder 72 performs the inverse function of the address encoder 53. As indicated above, with the algebraic interleaving process described herein the structure of the de-interleaver can be exactly the same as the structure of the interleaver, and correspondingly the address decoder 72 is exactly the same as the address encoder 53. Accordingly, the detailed structure of the address decoder 72 is not illustrated in FIG. 3, it being identical to the structure of the address encoder 53 as shown in FIG. 3. It can be appreciated that this same-structure characteristic of the complementary operations for interleaving and de-interleaving provides a substantial advantage and simplification in implementing these functions.

The outputs of the address decoder 72 are buffered in the store 73, and the buffered outputs from the store are compared in the comparators 74 with the current counts k and l of the row counter 51 and column counter 52 respectively of the channel interleaver 28, to provide a selector control signal on a line 77 with a predetermined state when the compared values are the same. The selector control signal is thus produced on the line 77 with this state at each time that a bit on the line 66 is to be punctured or repeated. At other times, for bits which are not punctured or repeated, the control signal on the line 77 controls the selector 75 to supply to its output line 76, synchronously as determined by the clock signal CLK, a bit from the line 66 supplied to a middle one (as shown in FIG. 3) of three inputs of the selector 75. At the time of each bit to be repeated or punctured, the control signal on the line 77 instead controls the selector 75 to supply to its output line a bit from either its upper input or its lower input (as shown in FIG. 3), depending upon whether bits are to be repeated or punctured respectively, as determined by a further control input P/R to the selector 75. The upper input of the selector 75 is connected to the output line 76 to provide for bit repetition, and the lower input of the selector 75 is illustrated as having no connection to provide for bit puncturing. As indicated above, a constant output data bit rate for the interleaved and rate matched data bits is provided by a buffer (not shown) to which data bits on the output line 76 are supplied.

Because of the address decoding provided by the decoder 72 in the rate matching function 26, the rate matching address generator 70 can simply determine the desired pattern of punctured or repeated bits in terms of the normal matrix addresses in the manner described above with reference to FIG. 2, using the single parameter $e_{os}$ determined in a desired manner to optimize this pattern. For example, this parameter could be determined by an equation such as $e_{os}=[2py+1]mod2N_r$, where as described above y is the number of bits to be punctured or repeated for each column of the matrix, and p is a column index from 0 to 7 (for the case of $N_c=8$).

This example, with interleaving as described above of 8 data transport frames each of 10 bits, and requiring a maximum puncturing ratio of 20% to produce channel interleaved and rate matched radio frames each of 8 bits (a total of 16 out of 80 bits being punctured or deleted), is further illustrated by the following Tables 1, 2, and 3. Thus $N_c=8$ and $N_r=10$. Table 1 illustrates entry of the 80 data bits, numbered 0 to 79, row by row in a 10 by 8 natural matrix with the row index k from 1 to 10 and the column index l from 1 to 8:

TABLE 1

|   |    | 1 |   |   |   |   |   |   |   |
|---|----|---|---|---|---|---|---|---|---|
|   |    | 1 | 2 | 3 | 4 | 5 | 6 | 7 | 8 |
| k | 1  | 0 | 1 | 2 | 3 | 4 | 5 | 6 | 7 |
|   | 2  | 8 | 9 | 10 | 11 | 12 | 13 | 14 | 15 |
|   | 3  | 16 | 17 | 18 | 19 | 20 | 21 | 22 | 23 |
|   | 4  | 24 | 25 | 26 | 27 | 28 | 29 | 30 | 31 |
|   | 5  | 32 | 33 | 34 | 35 | 36 | 37 | 38 | 39 |
|   | 6  | 40 | 41 | 42 | 43 | 44 | 45 | 46 | 47 |
|   | 7  | 48 | 49 | 50 | 51 | 52 | 53 | 54 | 55 |
|   | 8  | 56 | 57 | 58 | 59 | 60 | 61 | 62 | 63 |
|   | 9  | 64 | 65 | 66 | 67 | 68 | 69 | 70 | 71 |
|   | 10 | 72 | 73 | 74 | 75 | 76 | 77 | 78 | 79 |

The channel interleaving as described above produces a randomized matrix as shown by the following Table 2:

TABLE 2

|   |    | 1 |   |   |   |   |   |   |   |
|---|----|---|---|---|---|---|---|---|---|
|   |    | 1 | 2 | 3 | 4 | 5 | 6 | 7 | 8 |
| k | 1  | 57 | 40 | 79 | 62 | 45 | 28 | 11 | 74 |
|   | 2  | 35 | 18 | 1 | 64 | 23 | 6 | 69 | 52 |
|   | 3  | 13 | 76 | 59 | 42 | 25 | 8 | 47 | 30 |
|   | 4  | 71 | 54 | 37 | 20 | 3 | 66 | 49 | 32 |
|   | 5  | 73 | 56 | 15 | 78 | 61 | 44 | 27 | 10 |
|   | 6  | 51 | 34 | 17 | 0 | 39 | 22 | 5 | 68 |
|   | 7  | 29 | 12 | 75 | 58 | 41 | 24 | 63 | 46 |
|   | 8  | 7 | 70 | 53 | 36 | 19 | 2 | 65 | 48 |
|   | 9  | 9 | 72 | 31 | 14 | 77 | 60 | 43 | 26 |
|   | 10 | 67 | 50 | 33 | 16 | 55 | 38 | 21 | 4 |

The rate matching as described above then punctures 16 bits, 2 from each column of the randomized matrix, in a pattern produced by the rate matching algorithm to give a punctured randomized matrix as shown by the following Table 3:

TABLE 3

| | | 1 | | | | | | |
|---|---|---|---|---|---|---|---|---|
| | 1 | 2 | 3 | 4 | 5 | 6 | 7 | 8 |
| k  1 | 57 | 40 | 79 | 62 | 45 | 28 |    | 74 |
|    2 | 35 | 18 | 1  |    | 23 | 6  | 69 | 52 |
|    3 | 13 | 76 | 59 | 42 |    | 8  |    | 30 |
|    4 | 71 |    | 37 | 20 | 3  | 66 | 49 |    |
|    5 | 73 | 56 | 15 | 78 |    | 44 | 27 | 10 |
|    6 | 51 |    | 17 | 0  | 39 | 22 | 5  |    |
|    7 |    | 12 |    | 58 | 41 | 24 | 63 | 46 |
|    8 | 7  | 70 | 53 | 36 | 19 |    | 65 | 48 |
|    9 |    | 72 |    | 14 | 77 | 60 | 43 | 26 |
|   10 | 67 | 50 | 33 |    | 55 |    | 21 | 4  |

The channel interleaved and rate matched data bits are derived column by column from Table 3, i.e., with the order [57, 35, . . . , 51, 7, 67, 40, . . . , 26, 4]. The punctured bits are 2, 9, 11, 16, 25, 29, 31, 32, 34, 38, 47, 54, 61, 64, 68, and 75, for which the maximum puncture distance is 9 (25−16) and the minimum puncture distance is 1 (32−31); this small minimum puncture distance indicates that this particular example is not optimum, a larger minimum puncture distance being desirable. It can be appreciated that numerous other determinations of the parameters, and in particular of the parameter $e_{os}$, can be provided to optimize the puncturing process.

As indicated above, it is desirable for operation of the second interleaver 34 not to degrade the performance achieved as a result of the first interleaver 28, and to this end it is advantageous for the second interleaver 34 to be reduced to a simple shuffling operation, which interleaves data streams with different QoS while retaining the spreading properties achieved by the first interleaver 28 for each QoS data stream.

Figure 4:
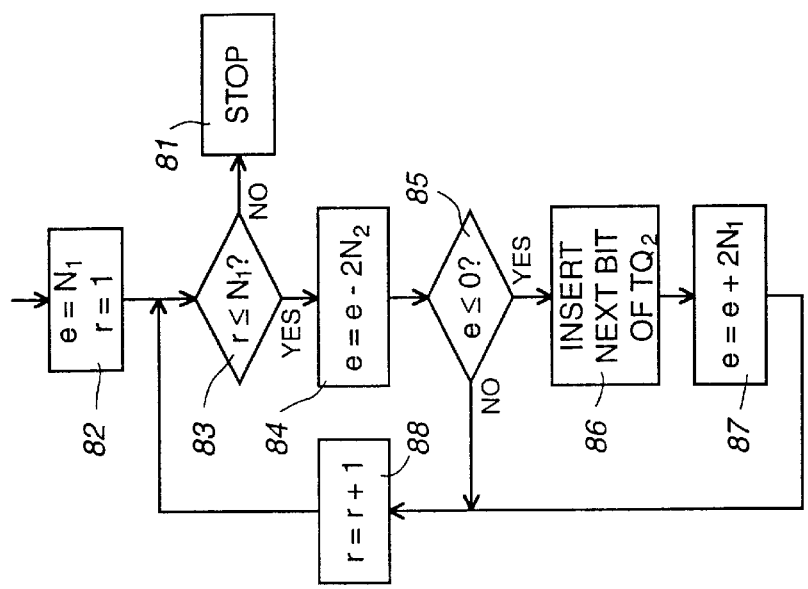
FIG. 4, which is on the same sheet as FIG. 2, is a flow chart relating to shuffling for a second stage of interleaving in the arrangement of FIG. 1.

FIG. 4 shows a flow chart of a bit shuffling algorithm which can be used advantageously to interleave bits of two data streams of interleaved radio frames provided as described above from respective service blocks 12 provided via the service multiplexer 10 in FIG. 1. Denoting one stream $TQ_1$ having frames of $N_1$ bits and a second stream $TQ_2$ having frames of $N_2$ bits, with $N_1 \geq N_2$, FIG. 4 illustrates how bits of the stream $TQ_2$ are inserted into the stream $TQ_1$.

Referring to FIG. 4, initially in a block 82 a parameter e is initialized to $N_1$ and a counter r is initialized to 1. In a block 83, it is determined whether $r \leq N_1$ and, if so, in a block 84 the value of e is reduced by $2N_2$. In a subsequent decision block 85 it is determined whether $e \leq 0$, and if so at a block 86 the next bit in the stream $TQ_2$ is inserted into the stream $TQ_1$, the value of e is increased by $2N_1$ in a block 87, the counter r is increased by 1 in a block 88, and a return is made to the decision block 83. A negative decision at the block 85 (i.e. e>0) results in a return to the block 83 via the block 88 to increment the counter r without any bit insertion or change in the value of e. A negative decision at the block 83 (i.e. $r>N_1$) indicates that the end of the frame has been reached, and accordingly the sequence ends at a stop block 81.

For more than two data streams, the same process is applied recursively for the successive data streams. It can be appreciated from the above description and the illustration in FIG. 4 that the steps of this process have a direct correlation with the steps of the puncturing and repetition processes of FIG. 2, so that implementation of this recursive shuffling process can be particularly convenient.

As indicated above, the puncturing of bits to achieve the desired rate matching is applied to data bits which have redundancy due to the FEC encoding provided by the encoders 22. One preferred form of encoding is so-called turbo (parallel concatenated convolutional) coding, in which the encoded data bits comprise the input data bits themselves, referred to as systematic data bits S, and parity bits P1 and P2 provided by convolutional coders operating on the input data bits and on interleaved input data bits. The parity bits P1 and P2 are typically punctured within the turbo coder to provide a desired rate turbo coder. For encoders 22 constituted by turbo coders, it is necessary to ensure that the subsequent rate matching function 26 does not puncture any of the systematic bits S, but only the parity bits P1 and/or P2. In the case of repetition, it has been determined that repetition of the parity bits P1 and P2 by a factor of the order of 2 or 3 times the repetition of the systematic bits S provides a performance gain.

Figure 5:
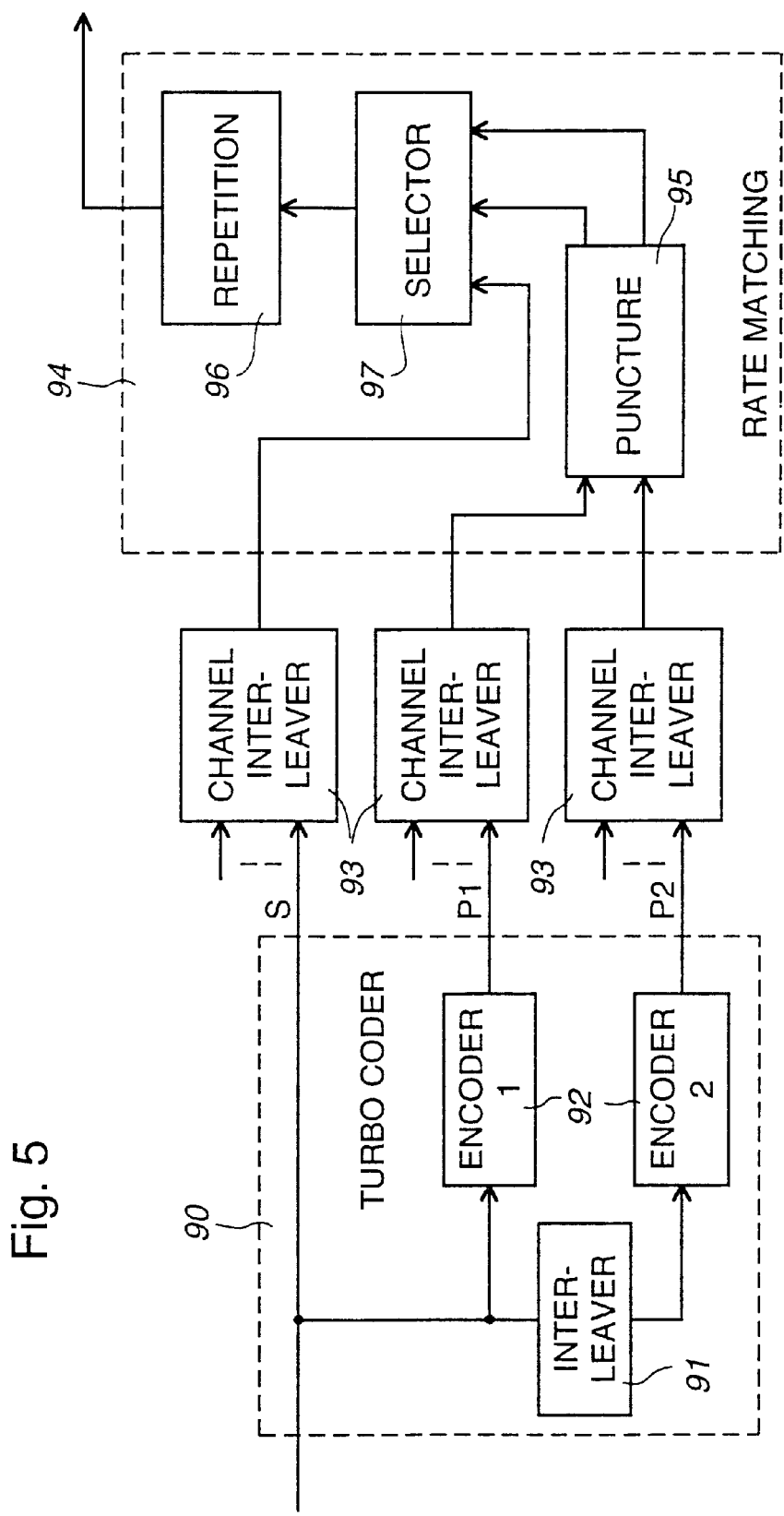
FIG. 5 illustrates a modification of part of the arrangement of FIG. 1 for channel interleaving and rate matching of data encoded by turbo (parallel concatenated convolutional) coding.

To these ends, FIG. 5 illustrates a modification of part of the arrangement of FIG. 1 for channel interleaving and rate matching of data encoded by turbo coding. Referring to FIG. 5, a turbo coder constituting one of the FEC encoders 22 is shown within a dashed line box 90 and, as is well known, comprises a turbo code interleaver 91 which interleaves input data bits, and two convolutional coders 92 which operate on the input data bits before and after interleaving to produce parity bits P1 and P2, the input data bits also being supplied to the coder outputs as systematic bits S. A puncturing block, not shown, may also be present to select only some of the parity bits P1 and P2 for supply to the coder outputs.

Instead of a single channel interleaver as described above, FIG. 5 illustrates that individual channel interleavers 93 are provided for the systematic bit stream and the parity bit stream. As shown in FIG. 5, there are three channel interleavers 93, but it can be appreciated that the streams of parity bits P1 and P2 can be combined and interleaved together, so that only two channel interleavers are provided, one for the systematic bit stream and the other for the parity bit-stream. Further inputs to the channel interleavers 93 in FIG. 5 indicate the multiplexing of systematic and parity bit streams, respectively, for multiple channels, corresponding to the multiplexer 24 in FIG. 1.

The rate matching function, which follows the channel interleavers 93, is shown within a dashed line box 94. A puncturing function 95 is applied only to the channel-interleaved parity bit streams, whereas a repetition function 96 can be provided to the parity and systematic bit streams, a selector 97 being illustrated to couple the channel-interleaved bits accordingly. The puncturing and repetition can be as described above. It can be appreciated that the illustration in FIG. 5 in this respect is intended diagrammatically to represent the principle that puncturing is not applied to the systematic bits, rather than showing an actual implementation of the rate matching function. It can be appreciated, for example, that puncturing or repetition, as required, could be applied only to the parity bit streams to provide the desired rate matching, without any puncturing or repetition of the systematic bit stream.

Although the above description refers to separate functions and units for the various processes described herein, it can be appreciated that these can in many cases be implemented using functions of one or more digital signal processors or other integrated circuits.

Although particular embodiments and examples of the invention have been described above, it can be appreciated that numerous modifications, variations, and adaptations may be made without departing from the scope of the invention as defined in the claims.

We claim:

1. A method of matching a rate of data bits, in a matrix of data bits interleaved by a predetermined interleaving process, to a desired rate by deletion of redundant data bits or repetition of data bits derived from the matrix, including the steps of:

determining in a non-interleaved matrix of said data bits a pattern of bits to be deleted or repeated to provide said desired data rate;

interleaving an address of each bit in said pattern to produce a respective address of the bit in the matrix of interleaved data bits; and deleting or repeating the respective bit in the interleaved data bits in dependence upon the respective address.

2. A method as claimed in claim 1 wherein the address decoding is performed in the same manner as a coding of addresses for producing the interleaved data bits from the non-interleaved matrix of said data bits.

3. A method as claimed in claim 1 wherein the pattern of bits to be deleted or repeated is dependent upon the number of bits to be deleted or repeated and a column index of the matrix.

4. A method as claimed in claim 1 wherein the interleaving process comprises permuting rows and columns of a matrix of $N_r$ rows and $N_c$ columns, in which data bits to be interleaved are represented row by row, in accordance with:

$$\text{Row Permutation } I_r(k)=[\alpha_r k + f_c(l)] \bmod N_r$$

$$\text{Column Permutation } I_c(l)=[\alpha_c l + f_r(k)] \bmod N_c$$

where $I_r(k)$ represents a data bit with a row index k, k is an integer from 1 to $N_r$, $\alpha_r$ is an integer, $f_c(l)$ is a non-zero function of a column index l, l is an integer from 1 to $N_c$, $I_c(l)$ represents a data bit with the column index l, $\alpha_c$ is an integer, $f_r(k)$ is zero or a function of the row index k, and $\bmod N_r$ and $\bmod N_c$ represent modulo-$N_r$ and modulo-$N_c$ arithmetic respectively, interleaved data bits being derived from the matrix column by column.

5. A method as claimed in claim 4 wherein $f_c(l)=ml+[N_r+1]\bmod 2$, where m is an integer.

6. A method as claimed in claim 5 wherein m is approximately equal to $N_r/N_c$.

7. A method as claimed in claim 4 wherein $f_r(k)+2k+[Nc+1]\bmod 2$.

8. A method as claimed in claim 4 wherein $\alpha_r$ is the largest prime number less than $N_r/\log_2(\log_2(N_r))$.

9. Rate matching apparatus arranged for carrying out a method as claimed in claim 1.

10. A method of interleaving data bits comprising permuting rows and columns of a matrix of $N_r$ rows and $N_c$ columns, in which data bits to be interleaved are represented row by row, in accordance with:

$$\text{Row Permutation } I_r(k)=[\alpha_r k + f_c(l)] \bmod N_r$$

$$\text{Column Permutation } I_c(l)=[\alpha_c l + f_r(k)] \bmod N_c$$

where $I_r(k)$ represents a data bit with a row index k, k is an integer from 1 to $N_r$, $\alpha_r$ is an integer, $f_c(l)=ml+[N_r1]\bmod 2$ is a non-zero function of a column index l, l is an integer from 1 to $N_c$, m is an Integer, $I_c(l)$ represents a data bit with the column index l, $\alpha_c$ is an integer, $f_r(k)=2k+[N_c+1]\bmod 2$, and mod2, $\bmod N_r$ and $\bmod N_c$ represent modulo-2, modulo-$N_r$, and modulo-$N_c$ arithmetic respectively, interleaved data bits being derived from the matrix column by column.

11. A method as claimed in claim 10 wherein m is approximately equal to $N_r/N_c$.

12. A method as claimed in claim 10 wherein $\alpha_r$ is the largest prime number less than $N_r/\log_2(\log_2(N_r))$.

13. A data interleaver arranged for carrying out the method of claim 10.

* * * * *